(12) United States Patent
Dehm et al.

(10) Patent No.: US 6,337,239 B1
(45) Date of Patent: Jan. 8, 2002

(54) LAYER CONFIGURATION WITH A MATERIAL LAYER AND A DIFFUSION BARRIER WHICH BLOCKS DIFFUSING MATERIAL COMPONENTS AND PROCESS FOR PRODUCING A DIFFUSION BARRIER

(75) Inventors: Christine Dehm; Carlos Mazure-Espejo, both of München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/391,720

(22) Filed: Sep. 8, 1999

(30) Foreign Application Priority Data

Sep. 8, 1998 (DE) .......................... 198 41 006

(51) Int. Cl.[7] .................. H01L 21/8242; H01L 21/20; H01L 29/76; H01L 31/119
(52) U.S. Cl. .................. 438/240; 257/295; 257/310; 257/306; 438/253; 438/504; 438/505; 438/506; 438/507; 438/508; 438/509
(58) Field of Search .................. 438/240, 504–509, 438/650, 686; 257/300–310, 288, 295, 296

(56) References Cited

U.S. PATENT DOCUMENTS

| | | | |
|---|---|---|---|
| 4,309,295 A | * 1/1982 | McSweeney | ............... 252/62.3 |
| 4,642,298 A | 2/1987 | Kuramoto et al. | |
| 5,330,931 A | 7/1994 | Emesh et al. | |
| 5,362,632 A | * 11/1994 | Mathews | ............... 438/152 |
| 5,523,596 A | * 6/1996 | Ohi et al. | ............... 257/296 |
| 5,859,760 A | * 1/1999 | Park et al. | ............... 361/313 |
| 5,918,118 A | * 6/1999 | Kim et al. | ............... 438/238 |
| 5,998,253 A | * 12/1999 | Loh et al. | ............... 438/243 |
| 6,010,940 A | * 1/2000 | Lee et al. | ............... 438/396 |
| 6,103,580 A | * 8/2000 | Guo | ............... 438/291 |
| 6,137,131 A | * 10/2000 | Wu | ............... 257/309 |
| 6,165,834 A | * 12/2000 | Agarwal et al. | ............ 438/240 |

FOREIGN PATENT DOCUMENTS

| | | |
|---|---|---|
| DE | 3103629 A1 | 11/1981 |
| DE | 69312233 T2 | 7/1997 |
| DE | 19640273 C1 | 3/1998 |
| DE | 19640240 A1 | 4/1998 |

OTHER PUBLICATIONS

"Process Integration for Nonvolatile Ferroelectric Memory Fabrication", Robert E. Jones et al., MRS Bulletin, Jun. 1996, pp. 55–58.

* cited by examiner

Primary Examiner—Eddie Lee
Assistant Examiner—Paul E Brock, II
(74) Attorney, Agent, or Firm—Herbert L. Lerner; Laurence A. Greenberg; Werner H. Stemer

(57) ABSTRACT

A layer configuration includes a material layer and a diffusion barrier which blocks diffusing material components. The barrier is disposed in the vicinity of a layer boundary of the material layer and is formed predominantly in grain boundaries of the material layer. A process for producing a diffusion barrier is also provided.

11 Claims, 2 Drawing Sheets

LAYER CONFIGURATION WITH A MATERIAL LAYER AND A DIFFUSION BARRIER WHICH BLOCKS DIFFUSING MATERIAL COMPONENTS AND PROCESS FOR PRODUCING A DIFFUSION BARRIER

BACKGROUND OF THE INVENTION

Field of the Invention

The invention relates to a layer configuration with a material layer and a diffusion barrier which blocks diffusing material components. The invention also relates to a process for producing a diffusion barrier to block diffusing material components.

A frequently encountered problem of production or operation processes is that of undesirable diffusion effects from material components, which effects need to be suppressed. A measure which is often used to achieve the suppression is the provision of diffusion barriers.

It is common to use layers of material which require a generation or post-treatment step at high temperature, especially in semiconductor technology, for example. That applies, for example, to ferroelectric materials or dielectric materials with a high dielectric constant, such as those which occur as dielectric or ferroelectric layers in capacitors, for example. In that specific case, for example, it is possible to use materials such as SBT $SrBi_2Ta_2O_9$, SBTN $SrBi_2(Ta_{1-x}Nb_x)_2O_9$, PZT $Pb_xZr_{1-x}TiO_3$ or BST $Ba_xSr_{1-x}TiO_3$. Those materials are known, for example, from German Patent DE 196 40 273 C1, corresponding to U.S. patent application Ser. No. 09/281,691, filed Mar. 30, 1999 and German Published, Non-Prosecuted Patent Application DE 196 40 240 A1, corresponding to U.S. patent application Ser. No. 09/281, 817, filed Mar. 30, 1999. However, it is also possible to use materials such as $Ta_2O_5$, $TiO_2$, oxides or oxynitrides. Temperatures of up to 800° C. are required for thermal treatment steps under an oxygen atmosphere in order to produce capacitors for integrated circuits using exactly the ferroelectric materials or dielectric materials with high dielectric constant which have been mentioned above.

Such high temperatures, in the presence of oxygen, promote the diffusion of material components from those material layers into adjoining layers, and diffusion of the oxygen which is required for the thermal treatment. For example, it is possible for oxides to escape through undesirable diffusion processes, for example $Bi_2O_3$ or PbO, which are able to diffuse into adjoining material layers with relative ease. The diffusion of the oxygen itself is also considerably promoted under such conditions. In addition, it is precisely at the relatively high temperatures being used that reactions of the escaping components with the adjoining layers are promoted.

Thus, there is a risk of the escaping material components having an adverse affect on further operating steps or damaging adjoining layers. For example, an adjoining electrode layer may be oxidized by escaping oxides or oxygen and thus a conductive connection can be interrupted, or else diffusion may take place through the electrode layer, e.g. a platinum layer, in which case the oxides or oxygen may react with adhesion promoters or insulation layers, such as $SiO_2$, which adjoin the electrode. Naturally, undesirable diffusion processes may also take place in the opposite direction, i.e. material components from adjoining layers may diffuse into the material layers mentioned above.

Similar problems arise primarily where material components are unable to escape from material layers as a result of diffusion or where readily diffusing, undesirable material components are present in certain areas or spaces, and layers, areas, gases or spaces, such as, for example, material layers, conductor areas, coating or analysis chambers which can be destroyed or damaged by the diffusing material components are present in the surrounding area. Thus the application of the invention is not restricted to semiconductor configurations with dielectric or ferroelectric layers, but rather the inventive concept may be employed in all areas in which diffusion of undesirable material components is to be prevented.

It is already known from an article entitled: Process Integration for Nonvolatile Ferroelectric Memory Fabrication, by R. E. Jones and S. B. Desu, in MRS Bulletin June 1996, pp. 55–58, that TiN or TaN are possible barrier materials, in particular for semiconductor configurations. However, those materials are not especially stable in particular at those high temperatures and are attacked after a relatively short time, in particular by oxides. On the other hand, titanium oxide or zirconium oxide are also proposed as diffusion barriers counteracting oxide diffusion from oxide-containing material layers. In that case, however, it is still intended to use a separate barrier layer to suppress the undesirable diffusion processes.

SUMMARY OF THE INVENTION

It is accordingly an object of the invention to provide a layer configuration with a material layer and a diffusion barrier which blocks diffusing material components and a process for producing a diffusion barrier, which overcome the hereinafore-mentioned disadvantages of the heretofore-known layers and processes of this general type and which provide an improved possibility for preventing diffusion processes.

With the foregoing and other objects in view there is provided, in accordance with the invention, a layer configuration, comprising a material layer having a layer boundary and grain boundaries; and a diffusion barrier blocking diffusing material components, the diffusion barrier disposed in the vicinity of the layer boundary of the material layer and formed predominantly in the grain boundaries of the material layer.

With the objects of the invention in view there is also provided a process for producing a diffusion barrier to block diffusing material components in the vicinity of a layer boundary of a material layer having grain boundaries, which comprises forming the diffusion barrier predominantly in the grain boundaries of the material layer.

It is possible to achieve an effective diffusion-inhibiting action by forming a diffusion barrier predominantly in the grain boundaries of a material layer. In this context, predominantly means that there may be a small covering of the surface of the material layer by diffusion-inhibiting substances in addition to the formation of the diffusion barrier in the grain boundaries. Preferably, however, the diffusion barrier is established exclusively in the grain boundaries.

The diffusion barrier may, for example, be formed by exceeding the solubility of the corresponding substance which exhibits the diffusion-inhibiting action in the material layer. This allows substances which exhibit a diffusion-inhibiting action in the grain boundaries of the material layer to be intercalated by precipitation in these very grain boundaries. This is of particular importance with regard to suppression of diffusion of substances which diffuse precisely through these grain boundaries of material layers. Therefore, it is precisely in such a case that the introduction of substances into the grain boundaries of a material layer constitutes a very effective diffusion barrier.

The substances which are to be intercalated may be selected in such a way that they scarcely react with the material layer, i.e. are substantially inert with respect to this material layer, at least under the boundary conditions under which the material layer and the diffusion barrier are produced and employed. In this case, there is no reason why the substances which are to be intercalated may not be reactive with respect to other substances or layers, for example with respect to auxiliary layers involved in the production process or with respect to the diffusing material components of which the diffusion is to be suppressed.

On the other hand, however, it is also possible to use substances which form a chemical compound with the material of the material layer in order to form the diffusion barrier.

A particular advantage of the invention is that the diffusion barrier which is provided does not have to be applied as an additional, independent layer, but rather can be integrated in a material layer which is already present. The diffusion barrier may be integrated, for example, directly in a material layer which is to be protected or in one or more material layers which are directly or indirectly adjacent the material layer which is to be protected. The material layer which is to be protected may be that layer which contains diffusing components or a layer which is sensitive to diffusing components. It is merely necessary to ensure that the diffusing components are kept away from those layers or areas on which they have an adverse affect.

For example, in the case of a capacitor as described above, the diffusion barrier may be applied directly to the dielectric or ferroelectric layer or may be provided on the adjoining electrodes, e.g. platinum electrodes. A configuration of an entire layer as a diffusion barrier between a dielectric and an electrode is already known from U.S. Pat. No. 5,330,931. The substances to be intercalated may be materials which are known from the prior art and which exhibit a diffusion-inhibiting action. Preference is given to intercalation of nitride or carbon in the material layer or in the grain boundaries.

Thus, the present invention constitutes a considerable simplification, on the basis of which it is possible to dispense with the application and treatment of an additional layer as a diffusion barrier. Thus, there are also no adverse affects from such an additional layer. The properties of the existing material layers are substantially unaffected by the generation of the diffusion barrier. The properties of the layer which carries the diffusion barrier are also scarcely changed, since there is only a generally physical intercalation of the diffusion-inhibiting, barrier-active substance. In order to produce a diffusion barrier according to the invention, it is preferably proposed that the substance to be intercalated be implanted, followed by a subsequent healing or recuperation step, ideally through the use of a thermal treatment, or, if there are oxidizable material layers, the preferred process which is to be described below.

The process is ideally applied to a material layer which, by dint of its spatial configuration, is able to assume the function of an effective diffusion barrier and in which the following process steps can easily be implemented. For example, if there is an oxide-insensitive electrode layer between an oxide-containing dielectric layer and an oxide-sensitive conductor or insulating layer, the barrier may, for example, be integrated in the dielectric layer or in the electrode layer. In this case, the order in which the individual material layers are or have been applied, i.e. which layer surfaces are accessible for the generation of a diffusion barrier, is to be taken into account.

An oxide layer is generated, for example by thermal oxidation, on the surface of an oxidizable material layer in which the diffusion barrier is to be integrated. Preferably, the oxide layer is then nitrided and it is possible, in principle, to intercalate substances other than those listed above in the oxide layer. In the process, an oxynitride is formed on the surface of the layer. At the same time, nitride is diffused into the nonoxidized electrode layer which lies beneath the oxide layer and the nitride is precipitated in the grain boundaries of the electrode layer, primarily in the area directly beneath the oxide layer, as a result of the solubility being exceeded.

Finally, the oxynitride layer is removed from the surface. Standard processes, such as in particular etching processes, may be employed for this purpose and the nitride remains in the grain boundaries. The surface area of the material layer which has been treated in this way and has the nitride intercalated in the grain boundaries then acts as a diffusion barrier. Since an oxidation step is provided as the first step of this process, the process can be used with success wherever there are oxidizable material layers. In those cases where the material layers cannot be oxidized, the process of implanting the substance may represent a suitable alternative.

Other features which are considered as characteristic for the invention are set forth in the appended claims.

Although the invention is illustrated and described herein as embodied in a layer configuration with a material layer and a diffusion barrier which blocks diffusing material components and a process for producing a diffusion barrier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
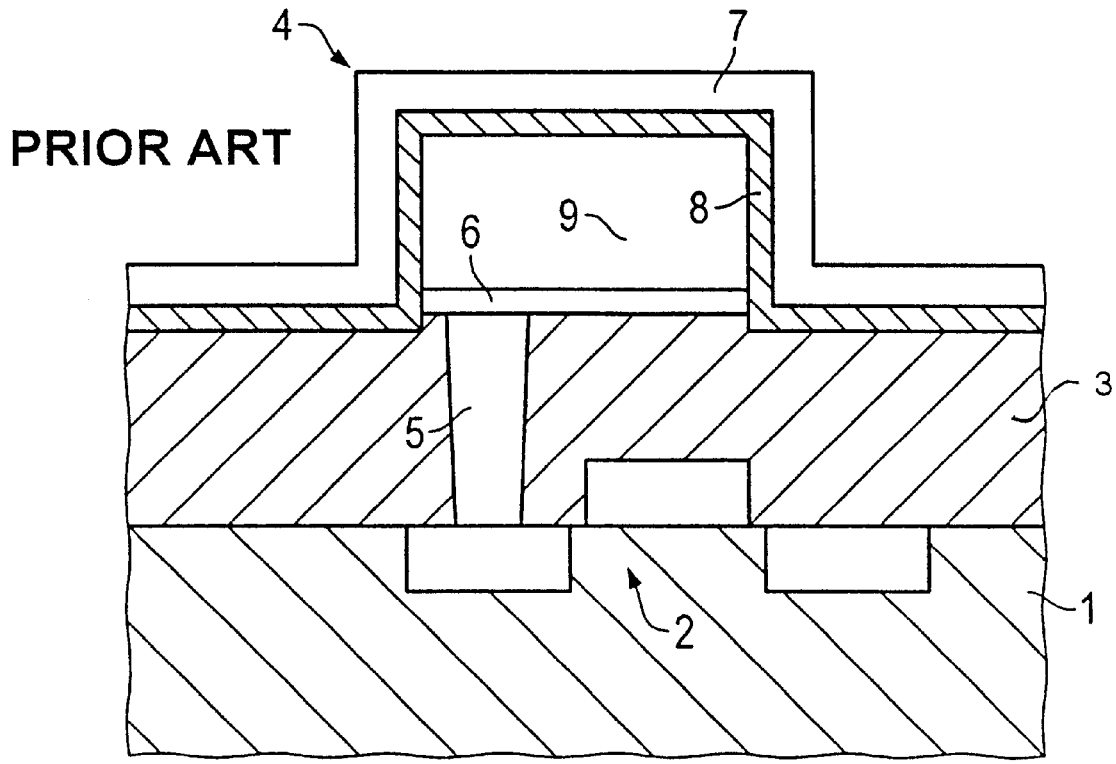
FIG. 1 is a fragmentary, diagrammatic cross-sectional view of a memory cell including a storage capacitor and a selection transistor according to the prior art.
Figure 5:
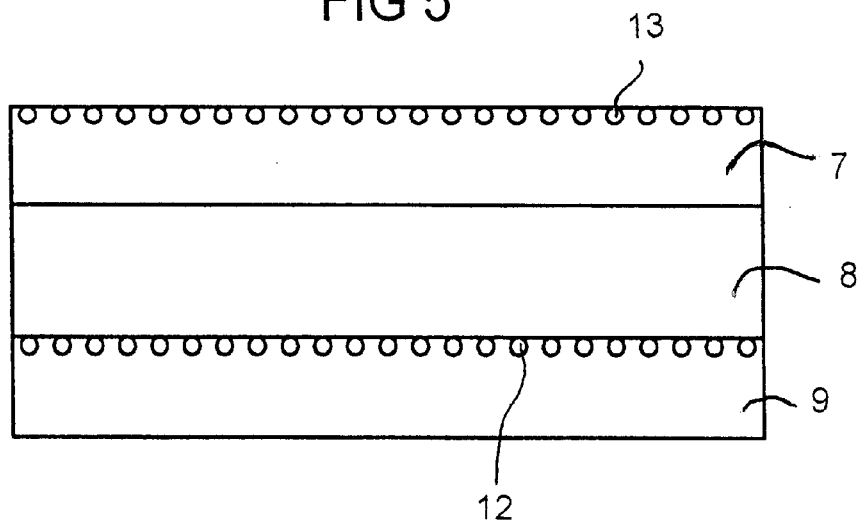
FIG. 5 is a cross-sectional view of a layer configuration of the storage capacitor with diffusion barriers in electrode layers.
Figure 2:
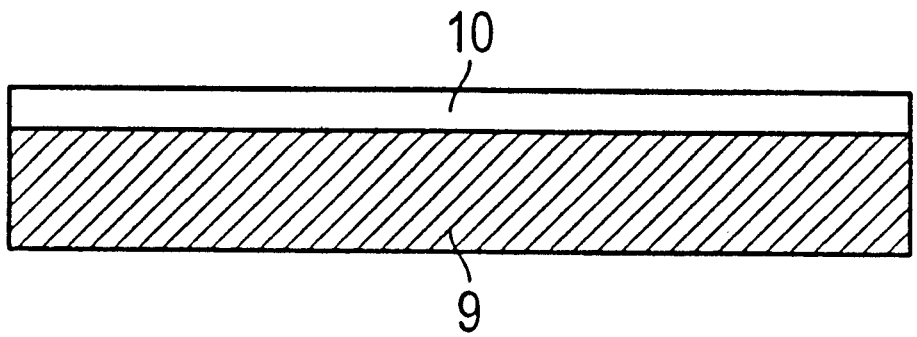
FIG. 2 is a cross-sectional view of an oxidized material layer.
Figure 3:
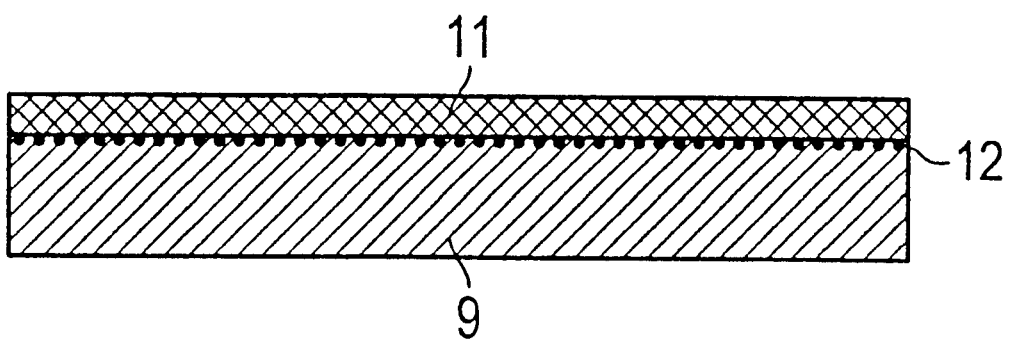
FIG. 3 is a cross-sectional view of a nitrided oxide layer.
Figure 4:
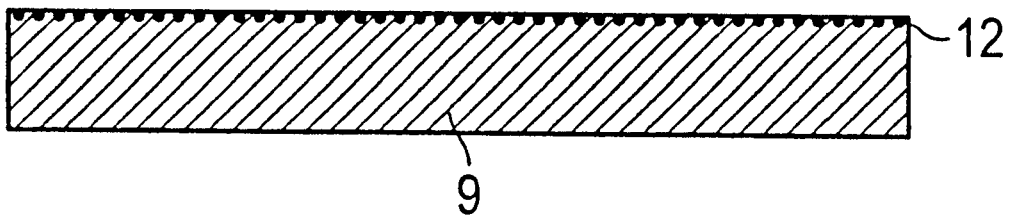
FIG. 4 is a cross-sectional view of a material layer with nitride in grain boundaries, after an oxynitride layer has been removed.

Referring now to the figures of the drawings in detail and first, particularly, to FIG. 1 thereof, there is seen a memory cell according to the prior art which is formed by a selection transistor 2 and a storage capacitor 4. The selection transistor 2 and the storage capacitor 4 are connected to one another by a conductive plug connection 5 which is made, for example, from tungsten or polysilicon or other suitable conductive material. The selection transistor 2 is embedded in a semiconductor substrate 1 and a first insulation layer 3 of $SiO_2$, through which the plug connection 5 is also led. The storage capacitor 4, which is situated on this layer 3, has two electrodes 7, 9 and a storage dielectric 8. The electrodes 7, 9 are made from an oxidizable conductive material, such as Ir, Ru or polysilicon, for example. The storage dielectric 8 is made from SBT $SrBi_2Ta_2O_9$, SBTN $SrBi_2(Ta_{1-x}Nb_x)_2O_9$, PZT $Pb_xZr_{1-x}TiO_3$ or BST $Ba_xSr_{1-x}TiO_3$, or alternatively from $Ta_2O_5$, $TiO_2$ or another dielectric or ferroelectric material.

A diffusion barrier layer 6 is disposed between the lower electrode 9 of the two electrodes 7, 9 and the conductive plug connection 5. This layer 6 primarily prevents diffusion of oxygen or of oxides, such as $Bi_2O_3$ or PbO, from the storage dielectric 8 through the lower electrode 9, in particular during thermal process steps for producing the capacitor at temperatures of up to 800° C. This layer 6 thus prevents a reaction of the $SiO_2$ of the insulating layer 3 with adhesion promoters which are disposed between the electrode 9 and the layer 3 located beneath it or even, in particular, with the conductive plug connection 5, to form nonconductive or volatile oxides, such as $SiO_2$ or $WO_3$.

According to the present invention which is illustrated in FIGS. 2–5, the diffusion barrier layer 6 becomes unnecessary. Instead, nitride 12 is intercalated in grain boundaries of the lower electrode layer 9 or of both electrode layers 7, 9. The process is described herein, by way of example, for the lower electrode layer 9, which is selected to be made from oxidizable material. Under the preconditions mentioned, firstly an oxidation step is carried out in order to generate an oxide layer 10 with a thickness of approximately 50 A, for example through the use of thermal oxidation at 925° C. for a duration of 60 seconds in an $O_2$ atmosphere. This is followed by nitriding of the oxide layer 10, with the result that this layer is converted into an oxynitride layer 11. This may, for example, be carried out through the use of rapid thermal nitridation RTN at 1050° C. for a duration of 30 seconds in an $NH_3$ atmosphere. The nitride migrates through the oxynitride layer 10 into the electrode layer 9, where nitride intercalations 12 are formed in grain boundaries of an immediately adjoining, nonoxidized part of the electrode layer 9 and the nitride is precipitated in those boundaries. The nitride intercalation takes place in a higher concentration in the vicinity of the boundary between the oxynitride layer 11 and the electrode layer 9. The nitride concentration in the grain boundaries decreases with increasing depth into the electrode layer 9. However, the present process steps allow a sufficient intercalation of nitride in the electrode layer 9 down to a depth in a range of from 30 to 40 nm.

Finally, the oxide layer 11 is removed by an etching step, for example by treatment with buffered HF (BHF), e.g. using 40:1 BHF for a duration of 70 seconds. The nitride intercalations 12 in the grain boundaries remain, acting as a diffusion-inhibiting barrier. After the dielectric 8 has been applied, the top electrode layer 7 can be applied to the configuration. A nitride intercalation 13 in the grain boundaries may likewise be provided in this top electrode layer, in which case the intercallation may be carried out in the same way as the steps of the process described above.

We claim:

1. A memory cell for integrated circuits, comprising:
   a selection transistor; and
   a storage capacitor including:
      a ferroelectric or dielectric storage dielectric with a high dielectric constant and having grain boundaries;
      a diffusion-sensitive material layer having a layer boundary and grain boundaries and being one of two electrode layers; and
      a diffusion barrier disposed between said storage dielectric and said material layer for blocking diffusing material components, said diffusion barrier disposed in the vicinity of said layer boundary of said material layer and said diffusion barrier formed of intercalations disposed in said grain boundaries of said storage dielectric.

2. The layer configuration according to claim 1, wherein another diffusion barrier is also formed of intercalations disposed in said grain boundaries of at least one of said electrode layers.

3. The layer configuration according to claim 1, wherein said storage dielectric is made from a material selected from the group consisting of SBT $SrBi_2Ta_2O_9$, SBTN $SrBi_2(Ta_{1-x}Nb_x)_2O_9$, PZT $Pb_xZr_{1-x}TiO_3$ and BST $Ba_xSr_{1-x}TiO_3$.

4. In a process for producing a diffusion barrier to block diffusing material components in the vicinity of a layer boundary of a material layer having grain boundaries, the improvement which comprises:
   forming the diffusion barrier predominantly in the grain boundaries of a storage dielectric of a storage capacitor of an integrated circuit by intercalating a substance selected from the group consisting of nitride and carbon into the storage dielectric in such a concentration that a volubility of the substance in the storage dielectric is exceeded.

5. The process according to claim 4, which comprises introducing the substance into the storage dielectric in such a concentration that a solubility of a chemical compound including the substance and a material of the storage dielectric is exceeded in the storage dielectric.

6. The process according to claim 4, which comprises carrying out the intercalation of the substance in the storage dielectric by an implantation step and a subsequent thermal healing step.

7. The process according to claim 4, which comprises carrying out the intercalation of the substance by the following steps:
   oxidation of a surface of the storage dielectric to form an oxide layer;
   intercalation of the substance in the entire oxide layer to form an altered oxide layer; and
   removal of the altered oxide layer on the surface of the storage dielectric.

8. The process according to claim 7, which comprises carrying out the intercalation step by chemically combining the substance with the oxide layer.

9. The process according to claim 7, which comprises carrying out the oxidation of the storage dielectric by thermal oxidation.

10. The process according to claim 7, which comprises carrying out the removal of the altered oxide layer in an etching step.

11. The process according to claim 4, which comprises carrying out the intercalation of the substance in at least one electrode layer of a storage capacitor of an integrated circuit.

* * * * *